(12) United States Patent
Gofuku

(10) Patent No.: US 6,190,911 B1
(45) Date of Patent: *Feb. 20, 2001

(54) SEMICONDUCTOR DEVICE AND FABRICATION METHOD THEREOF

(75) Inventor: Ihachiro Gofuku, Atsugi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/670,148

(22) Filed: Jun. 27, 1996

Related U.S. Application Data

(63) Continuation of application No. 08/212,919, filed on Mar. 15, 1994, now abandoned.

(30) Foreign Application Priority Data

Mar. 17, 1993 (JP) .................................... 5-081076
Jun. 16, 1993 (JP) .................................... 5-168419

(51) Int. Cl.⁷ ................................................ H01L 21/265
(52) U.S. Cl. ................ 435/365; 438/532; 438/597; 438/369
(58) Field of Search .................... 437/46, 27, 30, 437/31, 32, 109, 192, 200, 233, 975; 438/532, 365, 369, 527, 682, 537; 148/DIG. 124

(56) References Cited

U.S. PATENT DOCUMENTS

| 4,411,708 | * | 10/1983 | Winhan | 437/46 |
| 4,431,460 | * | 2/1984 | Barbar et al. | 437/46 |
| 4,637,836 | | 1/1987 | Flatley et al. | 148/1.5 |

(List continued on next page.)

FOREIGN PATENT DOCUMENTS

| 51904066/32 | * | 2/1984 | (EP) | 437/46 |
| 59-74671 | * | 4/1984 | (JP) | 437/46 |
| 61-242057 | * | 10/1986 | (JP) | 437/46 |
| 61-272972 | * | 12/1986 | (JP) | 437/46 |

(List continued on next page.)

OTHER PUBLICATIONS

"Dopant Diffusion and Grain Growth in Arsenic–Implanted Ply–Si", L.R. Zheng et al., Department of Materials Science and Engineering, Cornell University, Ithaca, NY, vol. 106, 1966 Materials Research Society pp. 135–141.

IBM Technical Disclosure Bulletin, Jun. 1984, U.S.A., vol. 27, No. 1B, p. 780, "Method for Increasing Grain Size in Silicon and Germanium by Successive Doping" by C. Grovenor, D.A. Smith and C.Y. Wong Patent Abstracts of Japan, V.15, N.236 (JP–3071657), Mar. 27, 1991.

Journal of Vacuum Science & Tech/Sec. B, Jul./Aug. 1987, USA, vol. 5, No. 4 pp. 865–869, by S.P. Murarka, et al, "Stability of Polycrystalline Silicon–on–Cobalt Disilicide–silicon Structures".

*Primary Examiner*—Savitri Mulpuri
(74) *Attorney, Agent, or Firm*—Fitzpatrick, Cella, Harper & Scinto

(57) ABSTRACT

A method for fabricating a semiconductor device having a wiring part connected via an opening portion formed in an insulting film on a semiconductor region to the semiconductor region. The wiring part includes a polycrystalline semiconductor layer and a metal or metal silicide on the semiconductor layer. A polycrystalline semiconductor layer is deposited over the opening portion of the semiconductor region. First and second impurities are respectively ion injected into the polycrystalline semiconductor layer, wherein the ion injecting range of the first impurities is longer than that of the second impurities, thereby forming a high concentration region at least on a surface side of the polycrystalline semiconductor layer. Following the ion injection of the first and second impurities, a heat treatment is conducted to grow crystals of the polycrystalline semiconductor layer. After the heat treatment, a metal or a metal silicide is deposited on the polycrystalline layer using a low melting point method.

7 Claims, 16 Drawing Sheets

Al DEPOSITION; PATTERNING

U.S. PATENT DOCUMENTS

| | | | |
|---|---|---|---|
| 4,728,391 | * 3/1988 | Lesk | 437/46 |
| 4,764,478 | 8/1988 | Hiruta | 437/29 |
| 4,978,629 | * 12/1990 | Komori et al. | 437/41 |
| 5,013,677 | * 5/1991 | Hozumi | 437/46 |
| 5,077,226 | * 12/1991 | Youn et al. | 437/47 |
| 5,147,813 | * 9/1992 | Woo | 437/46 |
| 5,177,030 | 1/1993 | Lee et al. | 437/47 |
| 5,196,233 | 3/1993 | Chan et al. | 437/186 |
| 5,242,858 | * 9/1993 | Sakamoto et al. | 437/46 |
| 5,346,836 | * 9/1994 | Manning et al. | 437/46 |
| 5,436,177 | * 7/1995 | Zaccherini | 437/46 |

FOREIGN PATENT DOCUMENTS

| | | | | |
|---|---|---|---|---|
| 63-142865 | * | 6/1988 | (JP) | 437/46 |
| 2-139923 | * | 5/1990 | (JP) | 437/46 |
| 4-213834 | * | 11/1990 | (JP) | 437/46 |
| 4-243137 | * | 8/1992 | (JP) | 437/46 |
| 5-29327 | * | 2/1993 | (JP) | 427/46 |
| 5-121326 | * | 5/1993 | (JP) | 437/46 |

\* cited by examiner

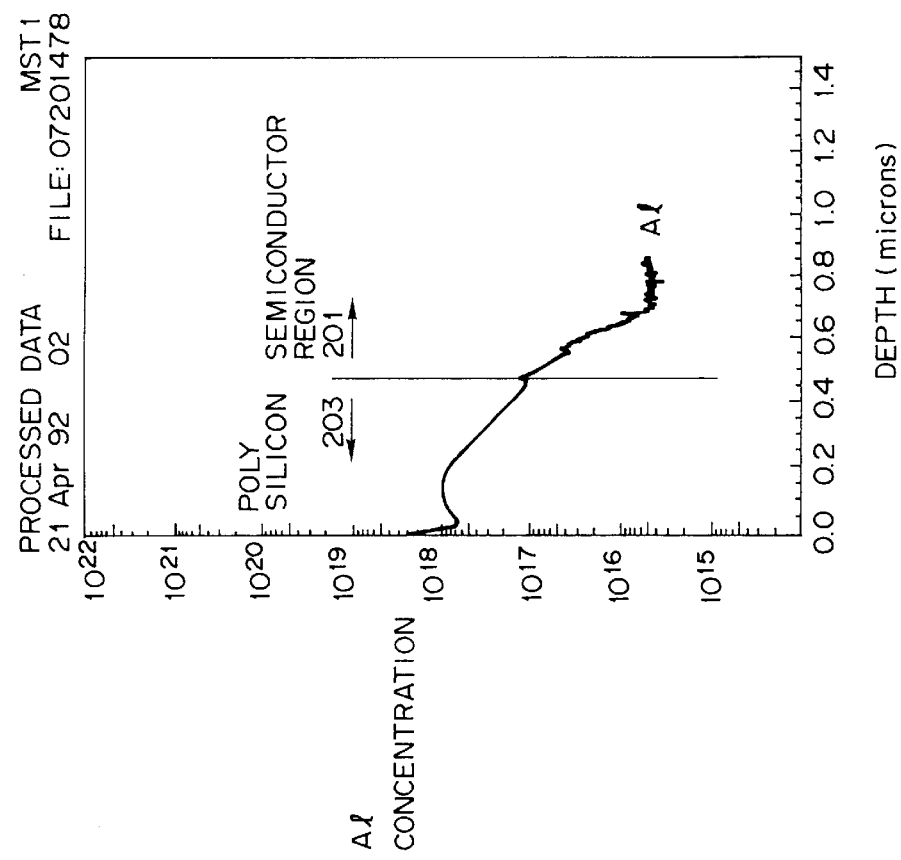
FIG. 2B PRESENT INVENTION
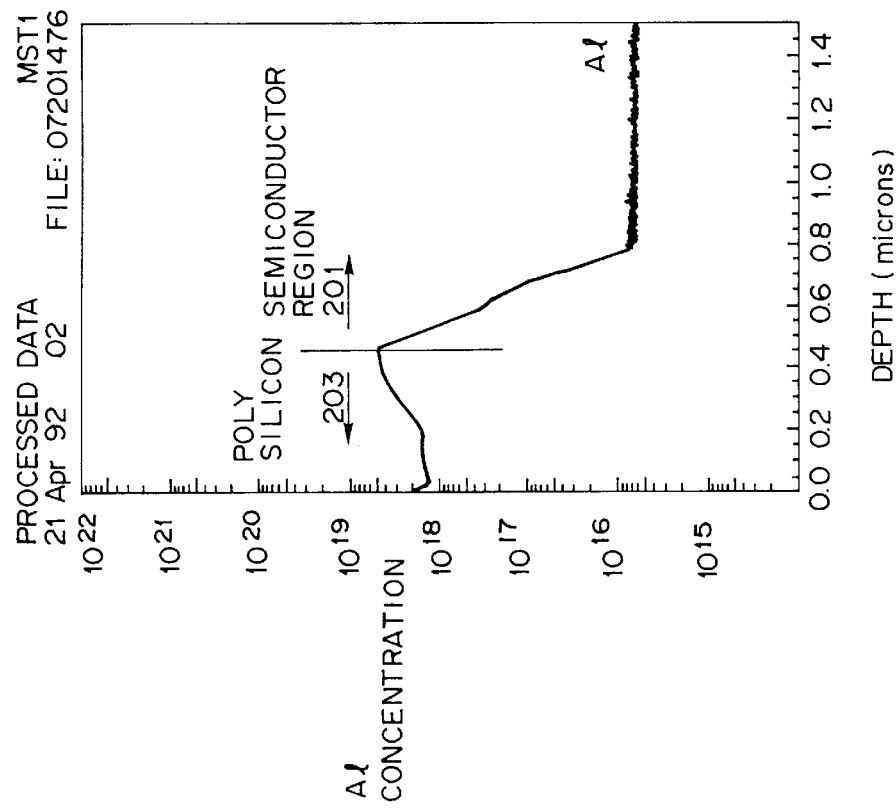
FIG. 2A PRIOR ART

NBL, PBL

EPITAXIAL GROWTH

P WELL, NBL CONTACT

FIELD OXIDATION

BASE

EMITTER

INTER LAYER INSULATION; CONTACT

POLY Si DEPOSITION; I/I

POLY Si PATTERNING

INTERLAYER INSULATION; CONTACT

Al DEPOSITION; PATTERNING

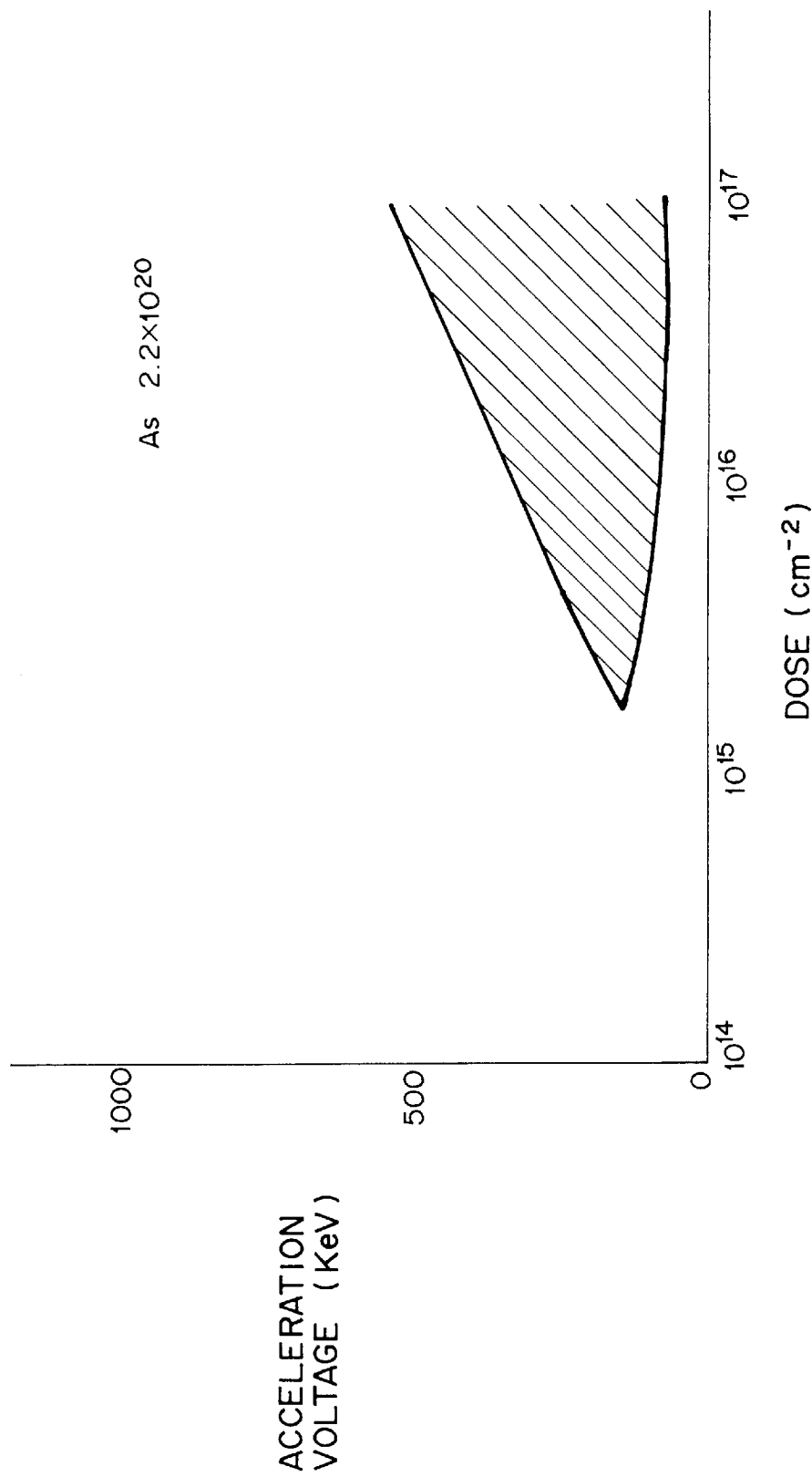

SEMICONDUCTOR DEVICE AND FABRICATION METHOD THEREOF

This application is a continuation-in-part of application Ser. No. 08/212,919, filed Mar. 15, 1994, now abandoned.

BACKGROUND OF THE INVENTION

1. Field of the Invention

The present invention relates to semiconductor devices and fabrication methods thereof, and more particularly to semiconductor devices wherein the connection of the semiconductor device with the wiring is improved and to fabrication methods thereof.

2. Related Background Art

In recent years, as the higher integration of semiconductor devices has been made, the area of each part within a chip has been reduced, wherein it is an important problem to reduce the area of the wiring part because it occupies a large percentage of the chip area. Concerning the lead-out part to the wiring of a semi-conductor device or a so-called contact part, while it was conventionally practiced that after an ohmic contact material composed of group IV polycrystalline semi-conductor material was laid down at a position directly above the element, the electrode of a metal or metal silicide containing a low-melting metal such as Al and the group IV polycrystalline semiconductor material were joined off the position directly above the element. It is contemplated that a metal or metal silicide is also joined directly above the element at the same time.

On the other hand, a polycrystalline semiconductor material (e.g., group N) is undesirable to use as the lead-out wiring, because as the operation frequency of the element increases, the movement of carriers for carrying electric current can not follow it, whereby such a constitution is now being adopted that the electrode of metal or metal silicide is contacted directly above the element from the viewpoint of high speed operation.

However, a low-melting metal in the metal or metal silicide for use as low resistive wiring material greatly diffuses into polycrystalline semiconductor material, and when a metal or metal silicide contact is made directly above the element, the low-melting metal will diffuse into the element portion, bringing the above degradation of element characteristics in some cases. Accordingly, to suppress the diffusion of low-melting metal, a barrier metal may be disposed between the metal or metal silicide and polycrystalline semiconductor material. With this constitution, the diffusion of a low-melting metal is surely suppressed, and there is no degradation of element characteristics, but because of a step of depositing and patterning the barrier metal interposed, the process is more complex, with increased cost.

SUMMARY OF THE INVENTION

An object of the present invention is to provide a semiconductor device and a fabrication method thereof, wherein with a structure and a method not involving any complex process and increased cost at the contact part of the semiconductor device, the diffusion of a low-melting metal can be suppressed without degradation of the element characteristics.

Also, it is another object of the present invention to provide a semiconductor device without degradation of the characteristics by preventing the diffusion of wiring metal to the element area of the semiconductor device, while simplifying the process by disposing wiring metal directly above the element area to eliminate unnecessary wiring.

Also, it is a further object of the present invention to provide a method for fabricating a semi-conductor device having a wiring part connected via an opening portion formed in an insulating film on a semi-conductor region to said semiconductor region, including the steps of:

depositing a polycrystalline semiconductor layer over said opening portion on said semiconductor region, ion injecting impurities having a large range into said polycrystalline semiconductor layer, ion injecting impurities having a small range into said polycrystalline semiconductor layer, conducting heat treatment after ion injection of said impurities, and depositing a metal or metal silicide containing a low-melting metal on said polycrystalline semi-conductor layer after said heat treatment.

Also, it is another object of the present invention to provide a semiconductor device comprised of a semiconductor region, an insulating film applied on said semiconductor region, and a wiring part connected via an opening portion formed in said insulating film to said semiconductor region, wherein said wiring part has disposed a metal or metal silicide at least containing a low-melting metal on an upper layer, and a polycrystalline semiconductor material containing p-type impurities on a lower layer, and at least one of the elements of germanium, tin, phosphorus, arsenic, antimony, gallium, and indium is injected into a group IV polycrystalline semiconductor material layer.

BRIEF DESCRIPTION OF THE DRAWINGS

FIGS. 2A and 2B are graphic representations for illustrating how polysilicon at the contact part and Al in the semiconductor region will diffuse.

FIG. 4, FIG. 7, and FIG. 10 are graphic representations for illustrating the ion injection condition which is set to accomplish a predetermined impurity concentration in practicing the present invention, respectively.

DETAILED DESCRIPTION OF THE PREFERRED EMBODIMENTS

The present invention can accomplish the aforementioned objects by using a fabrication method including the steps of ion injecting impurities having a large range into a polycrystalline semiconductor layer, and ion injecting impurities having a small range there-into.

Thereby, the impurity concentration near the surface of polycrystalline semiconductor layer can be especially raised.

Hence, the crystal having large crystal grain diameter can be formed particularly near the surface by heat treating the polycrystalline semiconductor layer such as polycrystalline silicon having such an impurity concentration distribution.

Typically, the diffusion of low-melting metal in the polycrystalline silicon can be made mostly through the grain boundary. Accordingly, as the crystal grain diameter increases, metal diffusion passages are reduced and the amount of diffusion is suppressed to a smaller value.

Thus, the present invention can suppress the diffusion of wiring metal formed on the upper layer by making the grain diameter of polycrystalline silicon larger than conventional.

In the case of silicon, when n-type semiconductor is made, there is a phenomenon that crystallization with heat treatment is promoted beginning from the impurity concentration of $5 \times 10^{20}$ atoms/cm$^3$ as the boundary so that polycrystalline silicon of large grain diameter can be obtained (see "1988 Materials Research Society Symposium Proceedings", pp. 135–48).

Accordingly, the present invention can securely realize the crystal of a large grain diameter in such a manner that the total concentration of p-type impurities contained in the polycrystalline semiconductor layer through an ion injection process of impurities is preferably greater than $5 \times 10^{19}$ atoms/cm$^3$ at a depth of 1000 Å from the surface of the polycrystalline semi-conductor layer, and more preferably greater than $5 \times 10^{20}$ atoms/cm$^3$.

Since this phenomenon begins to be saturated at a concentration of $1 \times 10^{21}$ atoms/cm$^3$ or more, it is desirable to add impurities of $1 \times 10^{21}$ atoms/cm$^3$ or more to implement this phenomenon in accordance with the present invention.

The present invention will be described below with reference to the drawings.

Figure 1:
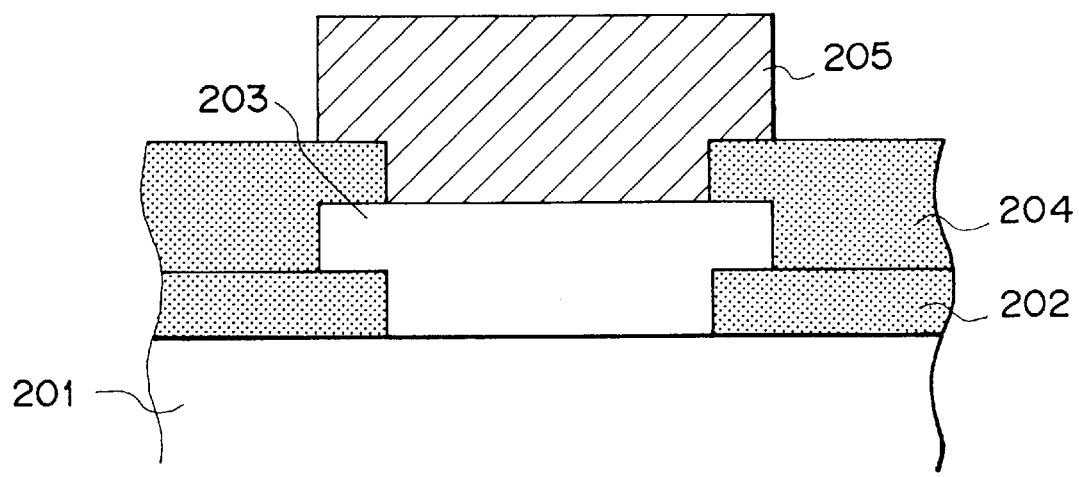
FIG. 1 is a typical cross-sectional view for describing a polysilicon/Al contact part.

FIG. 1 is a typical cross-sectional view showing the longitudinal structure of a contact part of a semi-conductor device. In this example, AlSi is used as one metal or metal silicide electrode 205, and polycrystalline silicon (polysilicon) is used as a polycrystalline semiconductor layer 203.

FIGS. 2A and 2B are graphs showing the measurement results (i.e., concentration change of Al) of how wiring metal Al is diffused into polysilicon 203 and semiconductor region 201 provided underneath thereof in such contact part.

FIG. 2A shows the Al concentration change from the surface of polycrystalline silicon 203 to semiconductor region 201 in the contact part made by a conventional fabrication method. Al has a concentration of $1 \times 10^{18}$ atoms/cm$^3$ or more within polycrystalline silicon 203, increasing at the interface between polycrystalline silicon 203 and semiconductor region 201. Also, it can be found that Al is also greatly diffused in the semiconductor region 201.

On the contrary, FIG. 2B shows a distribution of the Al concentration at the contact part made by the fabrication method of the present invention. As shown in the figure, Al is blocked on the surface side of the polycrystalline silicon 203, wherein the Al concentration in the polycrystalline silicon 203 decreases toward the semiconductor region 201. Also, within the semiconductor region 201, the Al concentration can be suppressed to $1 \times 10^{17}$ atoms/cm$^3$ or less, i.e., a lower concentration by one order of magnitude.

As described above, the diffusion of low-melting metal in polysilicon is typically made mostly through the grain boundary. Therefore, as the crystal grain diameter increases, metal diffusing passages are reduced, so that the amount of diffusion can be suppressed to a small value.

In the present invention, since the grain diameter of polysilicon which is a polycrystalline semiconductor material is greater than the conventional, the diffusion of metal has been suppressed. The grain diameter of polysilicon is determined by the recrystallization of polysilicon which occurs with the heat treatment after the injection of impurities, although recrystallization into a large grain diameter is more likely to occur if polysilicon is more amorphous in the state before recrystallization.

However, polysilicon will become amorphous upon impact of ion injection, but in the case of B which is a typical p-type impurity, for example, polysilicon does not greatly become amorphous only by the injection of B, because the mass of that ion is light. Accordingly, in the present invention, when a p-type is made, polysilicon is made more amorphous by injecting in advance germanium, tin, phosphorus, arsenic, antimony, gallium, or indium having a greater mass than B and not producing many defect levels in the semiconductor, and then the crystal of large grain diameter is produced with the heat treatment after the injection of p-type impurities. Further, the channeling of B can be suppressed by making polysilicon more amorphous before the injection of B, wherein there is an additional effect that the region to be made p-type may not be deeper than necessary.

Also, if the concentration of germanium, tin, phosphorus, antimony, gallium, or indium within polysilicon is $1 \times 10^{19}$ atoms/cm$^3$ or more, amorphous conversion will significantly progress to make polysilicon having a large grain diameter, and if the amorphous conversion is made to a depth of about 1000 Å, the diffusion of low-melting metal can be suppressed. Accordingly, to realize the present invention more securely, it is desirable to add at least one of the elements of germanium, tin, phosphorus, antimony, gallium and indium such that the amount is $5 \times 10^{19}$ atoms/cm$^3$ or more at a depth of 1000 Å from the surface of polysilicon, and the concentration of the element does not exceed the concentration of B over the entire area of polysilicon.

The low-melting metal contained in a metal or metal silicide for use with the present invention may be typically any of the metals belonging to groups IIB to IIIA, examples of which may include Al, Mg, Cu, Ag, Au, Zn and Cd.

For the injection of n-type impurities into polycrystalline silicon or polycrystalline silicon germanium, the injection impurity having a large range may be preferably high energy P, and the injection impurity having a small range may be preferably low energy P, as well as As, Sb, and Bi.

Embodiment 1

FIGS. 3A to 3K show the structure and fabrication process of an embodiment according to the present invention.

First, As$^+$ ions were implanted into a p-type substrate 1 under the conditions with a dose of $1 \times 10^{15}$ atoms/cm$^2$ and an acceleration voltage of 60 keV by a normal ion injection method, with a mask of desired shape, and thereafter the diffusion of As$^+$ ions was made by annealing in the N$_2$ atmosphere at 1000° C. to form an N-type blocking layer 101.

Figure 3A:
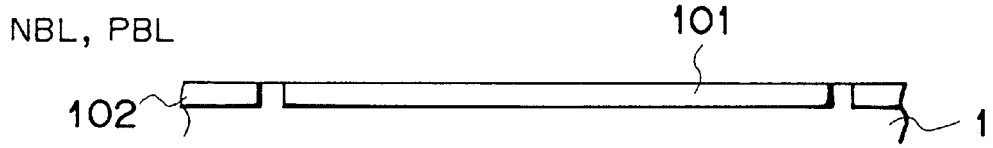
FIGS. 3A to 3K are typical cross-sectional views for illustrating the fabrication procedure of a semi-conductor device according to the present invention.

Subsequently, B$^+$ ions were implanted under the conditions with a dose of $2 \times 10^{13}$ atoms/cm$^2$ and an acceleration voltage of a 60 keV, with a mask of desired shape applied, and the diffusion of B$^+$ ions was made by annealing in the N$_2$ atmosphere at 1000° C. to form a P-type blocking layer 102 (FIG. 3A).

Figure 3B:
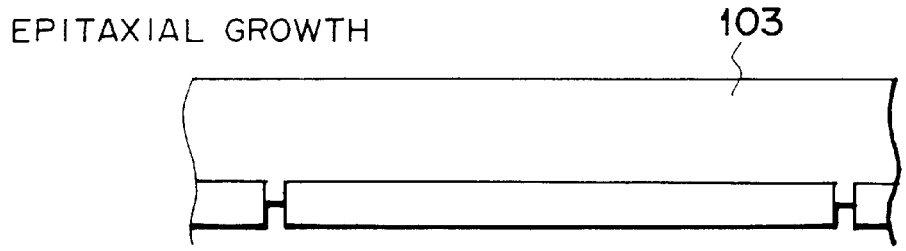

Epitaxial growth was made on this substrate to form an epitaxial layer 103 having a thickness of 5 μm (FIG. 3B).

Thereafter, B+ ions were implanted by normal ion injection method under the conditions with a dose of $6 \times 10^{12}$ atoms/cm$^2$ and an acceleration voltage of 100 keV, with a mask of desired shape applied, and the diffusion of B+ ions was made by annealing in the N$_2$ atmosphere at 1000° C. to form a P well 104.

Figure 3C:
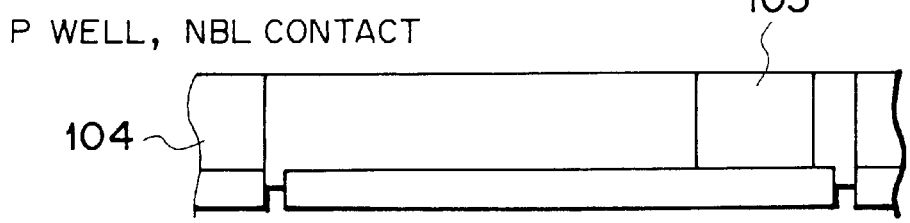

Subsequently, P+ ions were implanted by a normal ion injection method under the conditions with a dose of $7 \times 10^{15}$ atoms/cm$^2$ and an acceleration voltage of 70 keV, with a mask of desired shape applied, and the annealing was made in the N$_2$ atmosphere at 1000° C. to form a contact region 105 of the N-type blocking layer 101 (FIG. 3C).

Then, a silicon nitride film 106 was deposited 1500 Å thick by low pressure CVD and patterned in a desired shape.

Figure 3D:
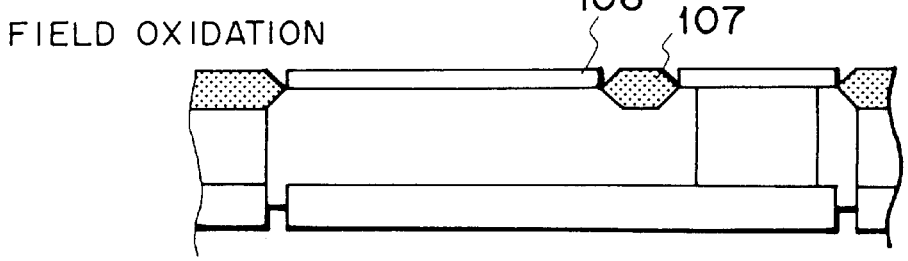

Subsequently, oxidation was made for five hours at 1000° C. in the atmo-sphere of O$_2$=4Λ/min, H$_2$=2Λ/min and N$_2$=5Λ/min to form a field oxide film 107, and then the silicon nitride film 106 was removed (FIG. 3D).

Figure 3E:
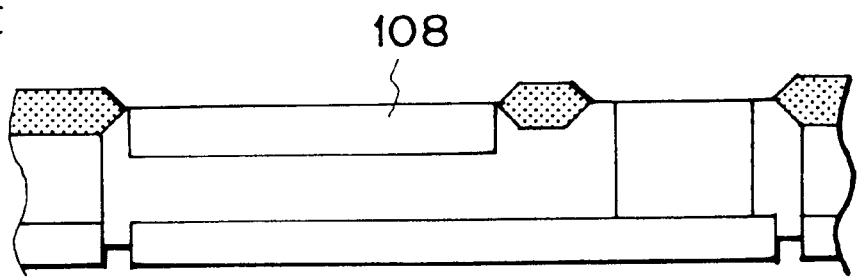

Thereafter, B+ ions were implanted by normal ion injection method under the condition with a dose of $6 \times 10^{12}$ atoms/cm$^2$ and an acceleration voltage of 80 keV, with a mask of desired shape applied, and the diffusion of B+ ions was made by annealing in the N$_2$ atmosphere at 1000° C. to form a base region 108 (FIG. 3E).

Figure 3F:
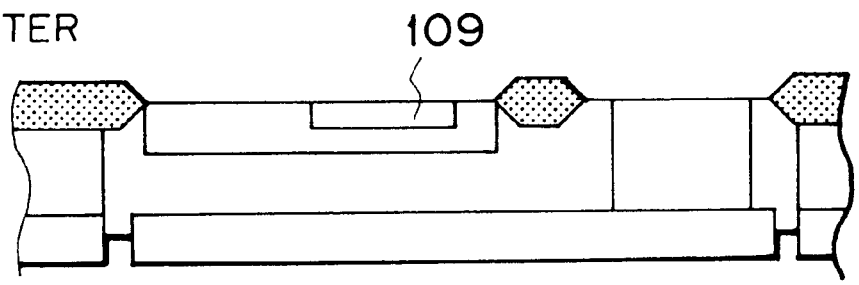

Further, As+ ions were implanted under the conditions with a dose of $1 \times 10^{15}$ atoms/cm$^2$ and an acceleration voltage of 40 keV, with a mask of desired shape applied, and the diffusion of As+ ions was made by annealing in the N$_2$ atmosphere at 1000° C. to form an emitter region 109 (FIG. 3F).

Figure 3G:
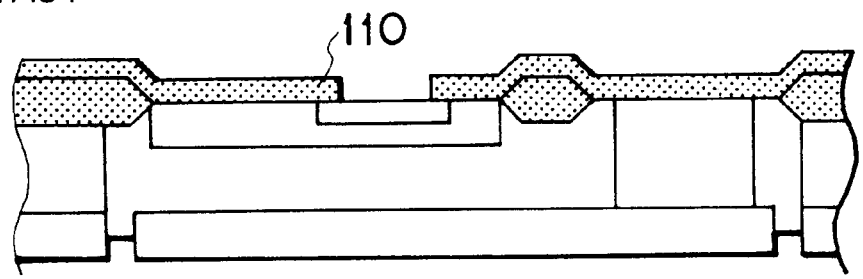

Thereafter, an SiO$_2$ film 110 was deposited 3000 Å thick by normal atmospheric pressure CVD to have an interlayer insulating film, and etched in a desired shape through a normal photolithography process to form an opening portion (FIG. 3G).

Subsequently, a polysilicon layer 111 was deposited 4400 Å thick by normal low pressure CVD.

Then, as the most characteristic process of the present invention, P+ ions were implanted into the polysilicon layer 111 with a dose of $5 \times 10^{15}$ atoms/cm$^2$ and an acceleration voltage of 80 keV through a step of injecting impurities having great range, and As+ ions were implanted with a dose of $5 \times 10^{15}$ atoms/cm$^2$ and an acceleration voltage of 120 keV through a step of injecting impurities having small range.

The ion injection conditions are such that when the resistance of the polysilicon layer is sufficiently decreased by setting the dose of P+ ions at about $5 \times 10^{15}$ atoms/cm$^2$, As+ ions are injected into the region as indicated by the slanted line in FIG. 4 to accomplish a desired object.

Figure 3H:
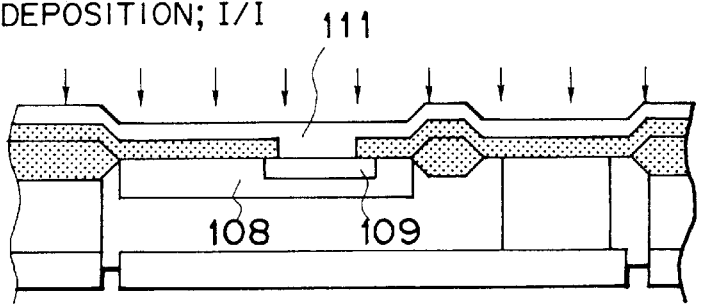

Thereafter, the diffusion of P+ ions and As+ ions was made by annealing in the N$_2$ atmosphere at 950° C. to convert the polysilicon layer into N-type (FIG. 3H).

Figure 3I:
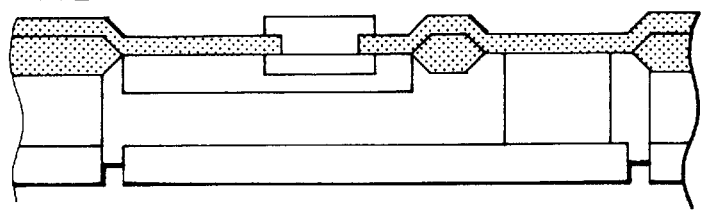

Subsequently, the polysilicon layer 111 was etched in a desired shape through a normal photo-lithography process (FIG. 3I).

Figure 3J:
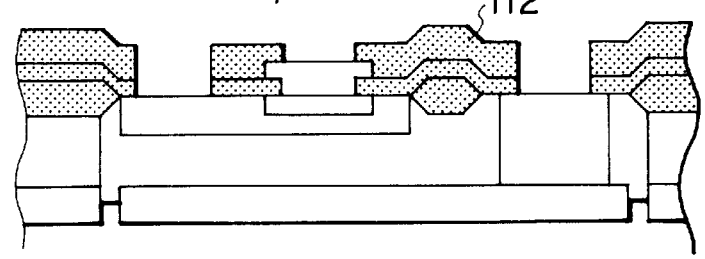

Thereafter, an SiO$_2$ film was deposited 6000 Å thick by normal atmosphere pressure CVD to have an interlayer insulating film 112, and etched in a desired shape through a normal photolithography process to form an opening portion (FIG. 3J).

Figure 3K:
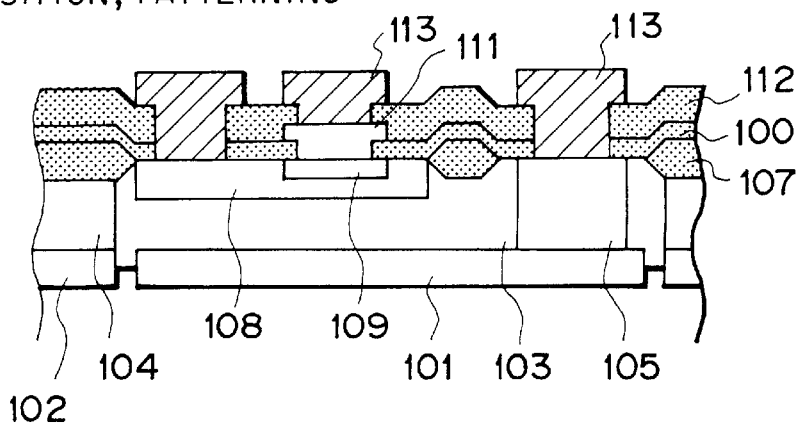

Then, AlSi 113 was deposited 10000 Å by a normal sputtering method, and subsequently, etched in a desired shape through a normal photolithography process. Further, heat treatment was conducted in the N$_2$ atmosphere at 450° C. for 30 minutes to make an alloy of AlSi 113 and polysilicon 111. Thereby, wiring electrodes 113 were formed and a semiconductor device of the present invention was completed (FIG. 3K).

Figure 5A:
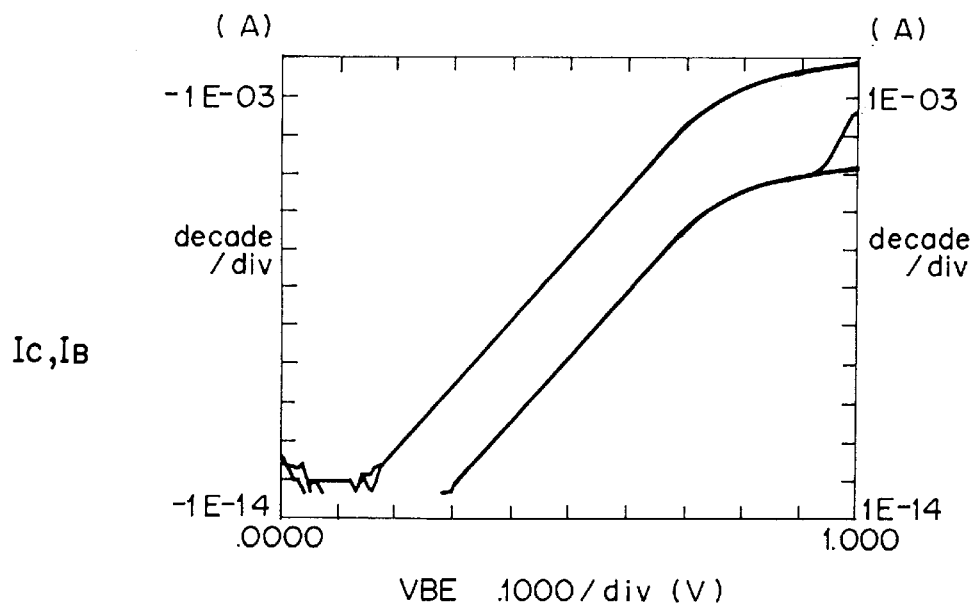
FIGS. 5A and 5B and FIGS. 11A and 11B are graphic representations for showing the effect of the present invention, and showing the Vbe-Ic, Ib characteristic of a bipolar transistor formed by applying the present invention, respectively.
Figure 5B:
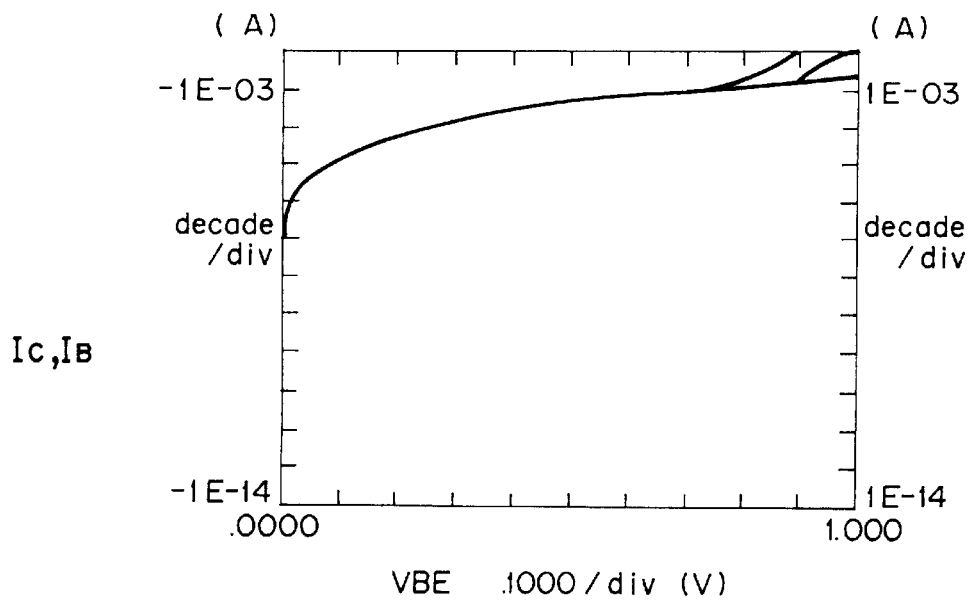

A comparison between the semiconductor device (semiconductor device A) formed in the above manner and the semiconductor device (semiconductor device B) formed without As injection into the polysilicon portion indicated that the leakage current in low a voltage range was very large in the Vbe-Ic, Ib characteristic for the semiconductor device B (FIG. 5B), while in the semi-conductor device A, it was almost suppressed, and there is clearly seen a relation that Ic, Ib depends exponentially on Vbe in the range of Vbe from 0 to 0.5 V (FIG. 5A)

Embodiment 2

Figure 6:
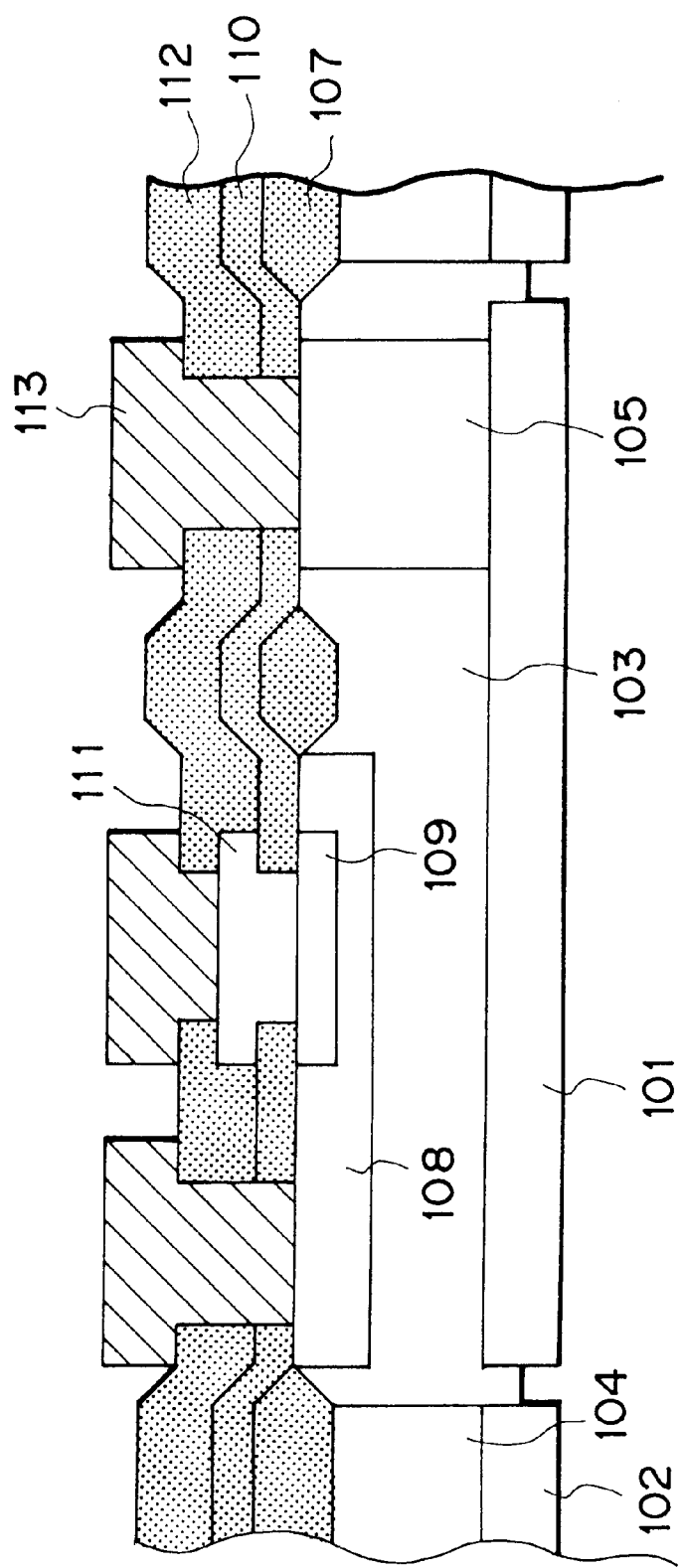
FIG. 6, FIG. 8, FIGS. 9A and 9B, FIG. 12, FIG. 13 and FIG. 14 are schematic views for describing other semiconductor devices of the present invention, respectively.

FIG. 6 shows the structure of a second embodiment according to the present invention. Each portion is similarly numbered to the embodiment 1. In this embodiment, a semiconductor device was fabricated in the same way as the embodiment 1, except that Sb ions were injected instead of As ions in the process as shown in FIG. 3H. Accordingly, the following explanation is given only regarding the process of FIG. 3H.

After the process was performed up to FIG. 3G in the same way as the embodiment 1, P+ ions were implanted into the polysilicon layer 111 with a dose of $7.5 \times 10^{15}$ atoms/cm$^2$ and an acceleration voltage of 80 keV through a step of injecting impurities having large range, and Sb+ ions were implanted with a dose of $5 \times 10^{15}$ atoms/cm$^2$ and an acceleration voltage of 180 keV through a step of injecting impurities having small range.

Figure 7:
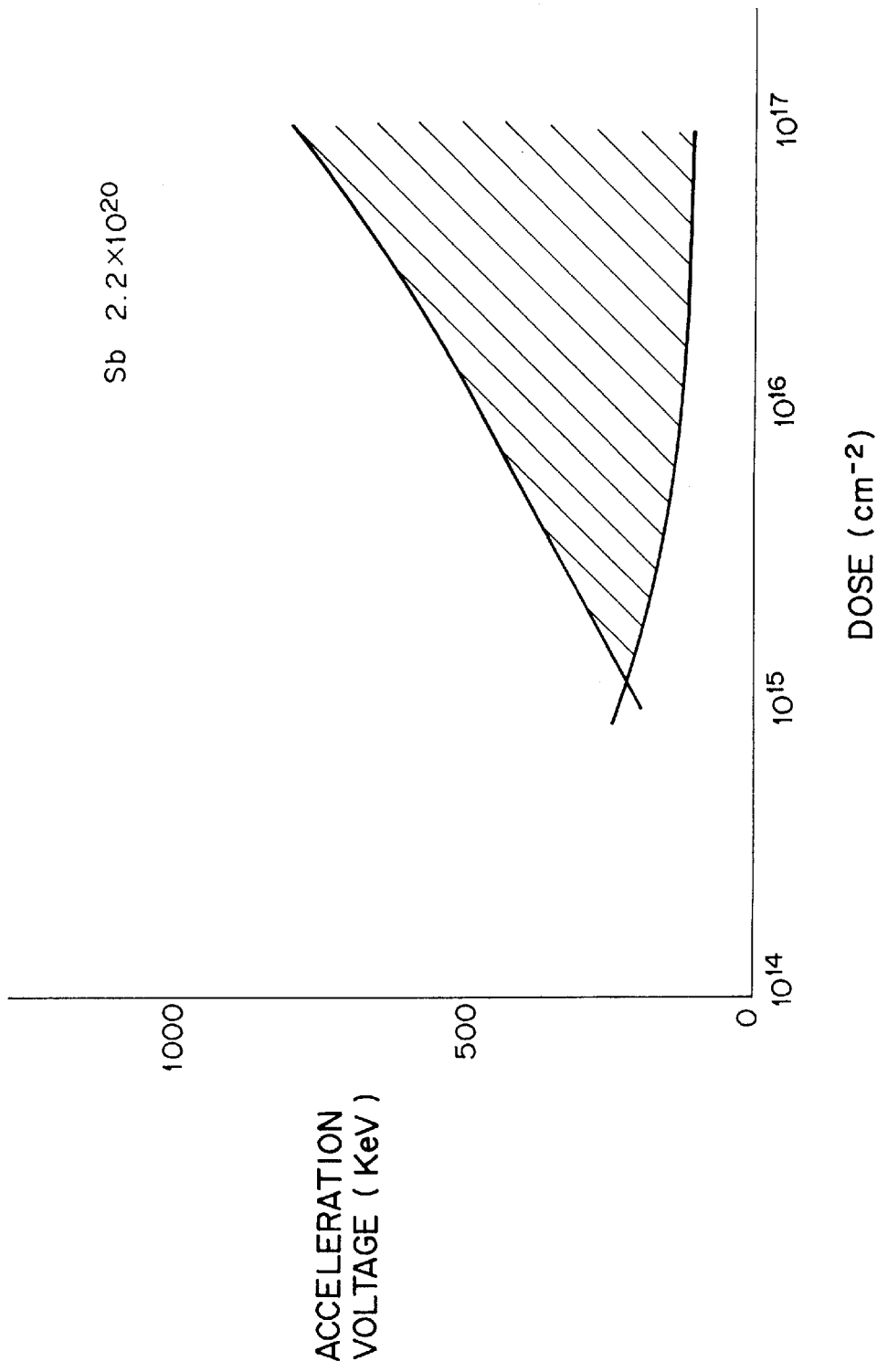

The ion injection conditions are such that when the resistance of the polysilicon layer is sufficiently decreased by setting the dose of P+ ions at about $7.5 \times 10^{15}$ atoms/cm$^2$, Sb+ ions are injected into the region as indicated by the slanted line in FIG. 7 to accomplish a desired object.

Thereafter, the diffusion of P+ ions and Sb+ ions was made by annealing in the N$_2$ atmosphere at 950° C. to convert the polysilicon layer into a N-type.

After that, the same process as the embodiment 1 was performed to fabricate a semiconductor device.

A comparison between the semiconductor device (semiconductor device C) formed in the above manner and the semiconductor device (semiconductor device B) formed without Sb injection into the polysilicon portion indicated that the leakage current in a low voltage range was very large in the Vbe-Ic, Ib characteristic for the semiconductor device B, while in the semiconductor device A, it was almost suppressed, and there was clearly seen a relation that Ic, Ib depends exponentially on Vbe in the range of Vbe from 0 to 0.5 V.

Embodiment 3

Figure 8:
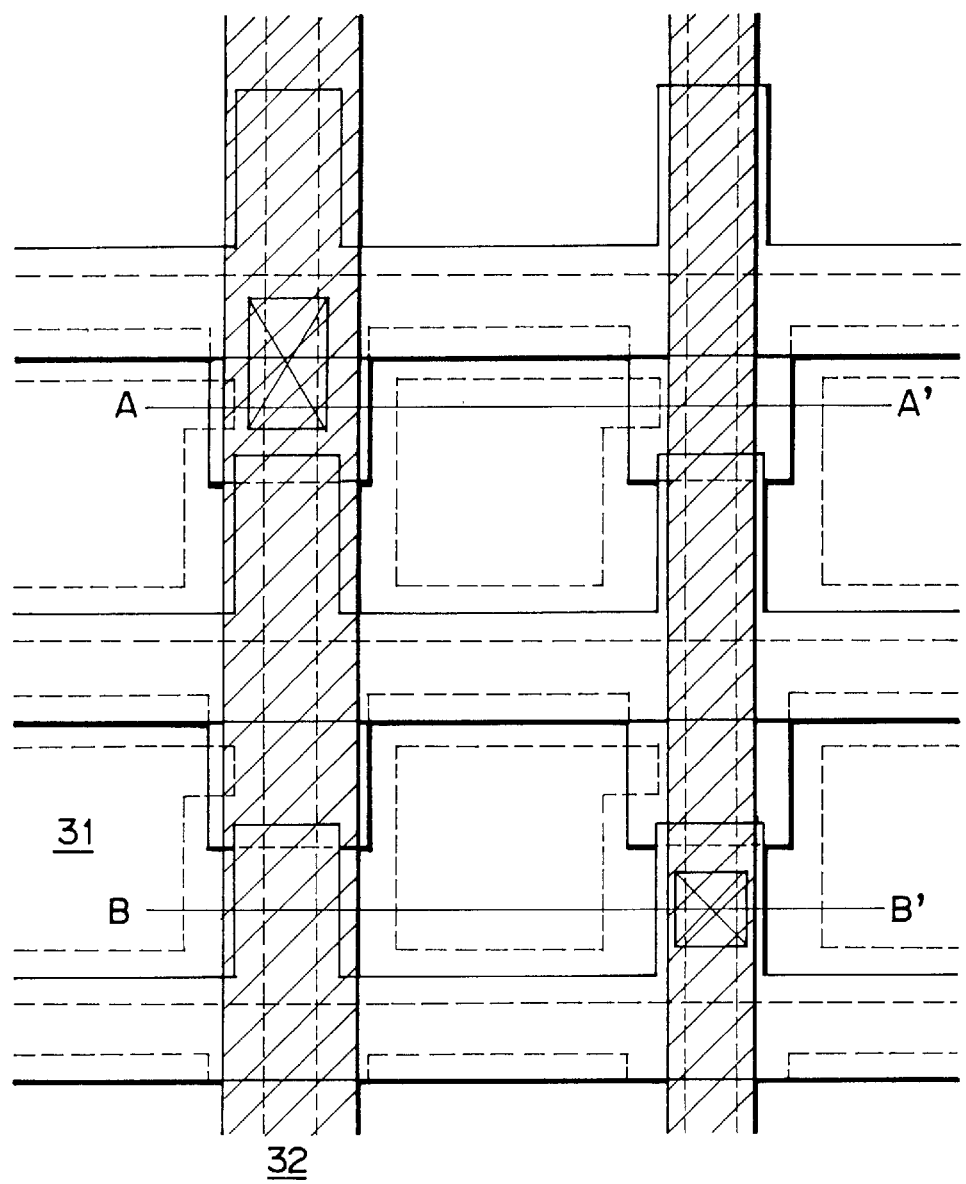
Figure 9A:
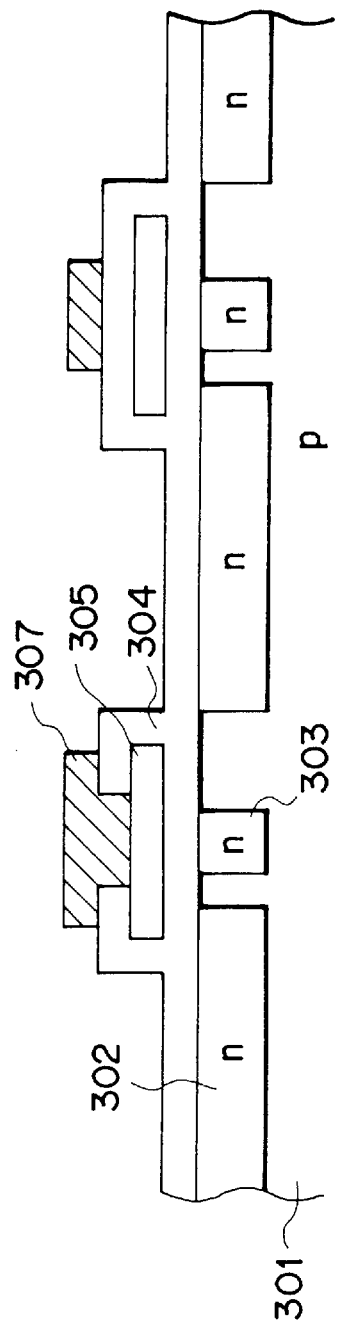
Figure 9B:
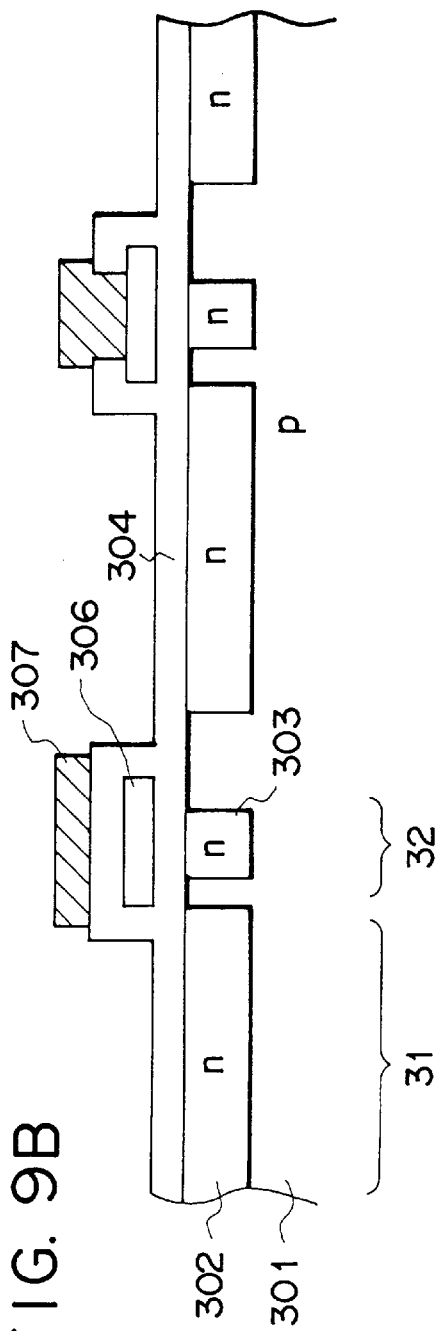

FIGS. 8 and 9A and 9B show the structure of a third embodiment according to the present invention. FIG. 8 is a plan view and FIGS. 9A and 9B are typical cross-sectional views taken along the line A—A' and B—B' in FIG. 8.

In this embodiment, a CCD was formed on a P-type silicon substrate through a normal CCD process.

FIG. 8 only shows a photodiode portion 31 and a vertical CCD (hereinafter referred to as a VCCD) portion 32.

In FIGS. 9A and 9B, a PN junction is formed between an N-type region 302 and a P-type substrate 301 to have a photodiode for detecting a photosignal. Also, a VCCD is formed from an N-type region 303 and polysilicon gate electrodes 305, 306, and the N-type region 303 becomes a potential well in performing storage or transfer of electric charges.

Herein, a method of the present invention is used for the doping of polysilicon gates 305, 306. That is, after a polysilicon layer 305 is deposited 4400 Å thick by normal LP-CVD, P$^+$ ions are implanted by a normal ion injection method with a dose of 7.5×10$^{15}$ atoms/cm$^2$ and an acceleration voltage of 80 keV, and further As$^+$ ions are implanted with a dose of 5×10$^{15}$ atoms/cm$^2$ and an acceleration voltage of 120 keV.

The ion injection conditions are such that when P$^+$ ions are implanted with a dose of about 7.5×10$^{15}$ atoms/cm$^2$, As$^+$ ions are injected into the region as shown in FIG. 4, similarly to the embodiment 1, to accomplish a desired object.

Thereafter, the diffusion of P$^+$ ions and As$^+$ ions was made by annealing in the N$_2$ atmosphere at 950° C. to convert the polysilicon layer into N-type.

After the polysilicon layer 305 was etched in a desired shape through normal photolithography process, an SiO$_2$ film was deposited 2000 Å thick by normal atmospheric pressure CVD to have an interlayer insulating film.

Then, a polysilicon layer 306 was deposited under the same conditions as the polysilicon layer 305, subjected to ion injection, further annealed similarly, and etched in a desired shape through a normal photo-lithography process to form an electrode shape. Subsequently, SiO$_2$ was deposited 6000 Å thick by normal atmospheric pressure CVD and a SiO$_2$ film was selectively opened through normal photolithography process to form a contact area with Al.

Thereafter, AlSi was deposited 10000 Å thick by a normal sputtering method, and subsequently, etched in a desired shape through a normal photolithography process. Further, heat treatment was conducted in the N$_2$ atmosphere at 450° C. for 30 minutes to make an alloy of AlSi and polysilicon. Thereby, wiring electrodes 307 were formed and a semiconductor device of the present invention was completed.

The semiconductor device as fabricated in the above way allows for a very high speed operation because the length of polysilicon as the wiring is short and the most portion is connected via Al wiring. And owing to no diffusion of Al into the lower portion of the polysilicon gate, the dispersion in transfer characteristic of charges was eliminated. Also, the contact between the polysilicon and Al can be made directly above the VCCD without interposition of the diffusion preventing layer of Al, whereby the fabrication process can be simplified.

Embodiment 4

The process as indicated in FIG. 3A to FIG. 3D was performed in the same manner as in the embodiment 1.

Thereafter, a silicon nitride film 106 was removed. Then, P$^+$ ions were implanted by a normal ion injection method with a dose of 4×10$^{13}$ atoms/cm$^2$ and an acceleration voltage of 85 keV, with a mask of a desired shape applied, and the diffusion of P$^+$ ions was made by annealing in the N$_2$ atmosphere at 1000° C. to form a base region 108 (FIG. 3E).

Further, BF$^+_2$ ions were implanted with a dose of 2×10$^{15}$ atoms/cm$^2$ and an acceleration voltage of 85 keV, with a mask of desired shape applied, and subsequently, the diffusion of BF$^+_2$ ions was made by annealing in the N$_2$ atmosphere at 1000° C. to form an emitter region 109 (FIG. 3F).

Thereafter, the process was performed in the same way as in FIG. 3G of embodiment 1, and as a lower layer structure of the wiring portion, a polysilicon layer 111 was deposited 4400 Å thick as a group IV polycrystalline semiconductor material by normal low pressure CVD.

Figure 10:
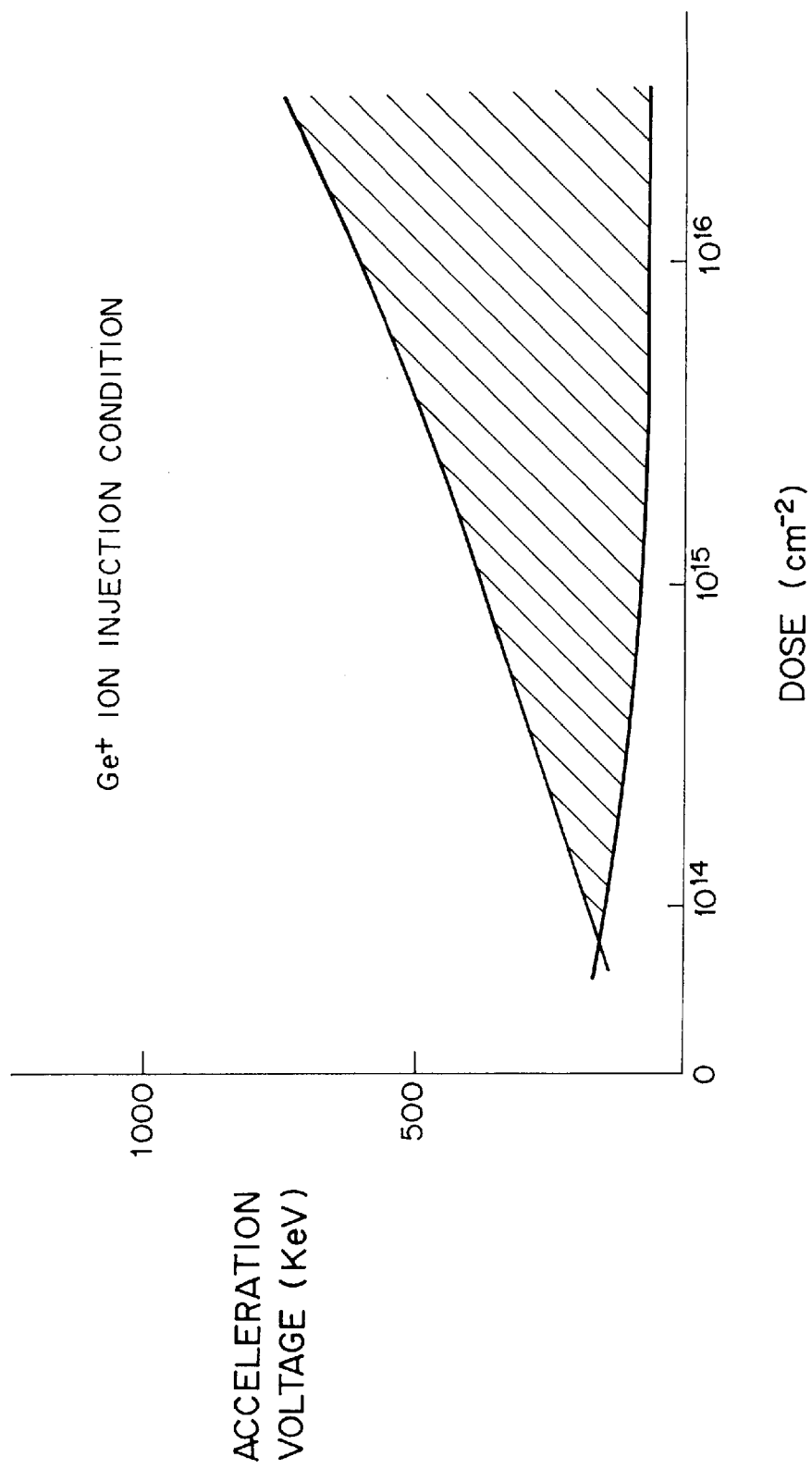

Then, Ge$^+$ ions were implanted into the polysilicon layer 111 with a dose of 5×10$^{14}$ atoms/cm$_2$ and an acceleration voltage of 150 keV through the first injection process of the present invention, and further B$^+$ ions as p-type impurities were implanted thereinto with a dose of 5×10$^{15}$ atoms/cm$^2$ and an acceleration voltage of 30 keV through the second injection process. Then, the diffusion of Ge$^+$ ions and B$^+$ ions was made by annealing in the N$_2$ atmosphere at 950° C. to convert the polysillicon layer into P-type. The injection of Ge$^+$ ions is desirably effected in the range as shown in FIG. 10 (FIG. 3H).

Thereafter, the process was performed in the same manner in embodiment 1 to fabricate a semiconductor device D.

Figure 11A:
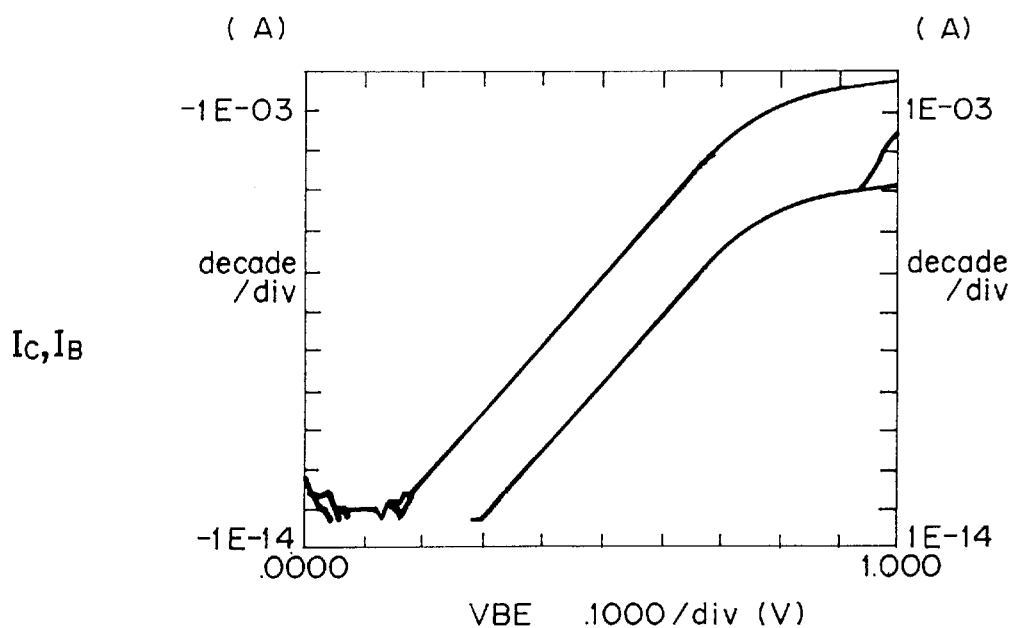
Figure 11B:
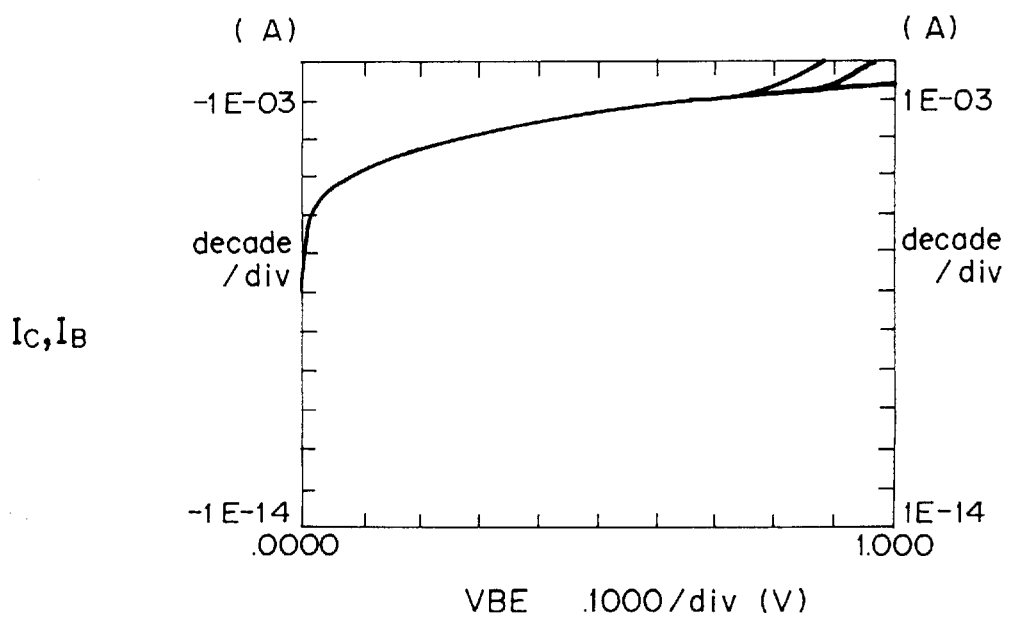

A comparison between the semiconductor device (semiconductor device D) formed in the above manner and the semiconductor device (semiconductor device B) formed without Ge injection into the polysilicon portion indicated that the leakage current in a low voltage range was very large in the Vbe-Ic, Ib characteristic for the semiconductor device B (FIG. 11B), while in the semiconductor device D, it was almost suppressed, and there was clearly seen a relation that Ic, Ib depends exponentially on Vbe in the range of Vbe from 0 to 0.5 V (FIG. 11A).

Embodiment 5

Figure 12:
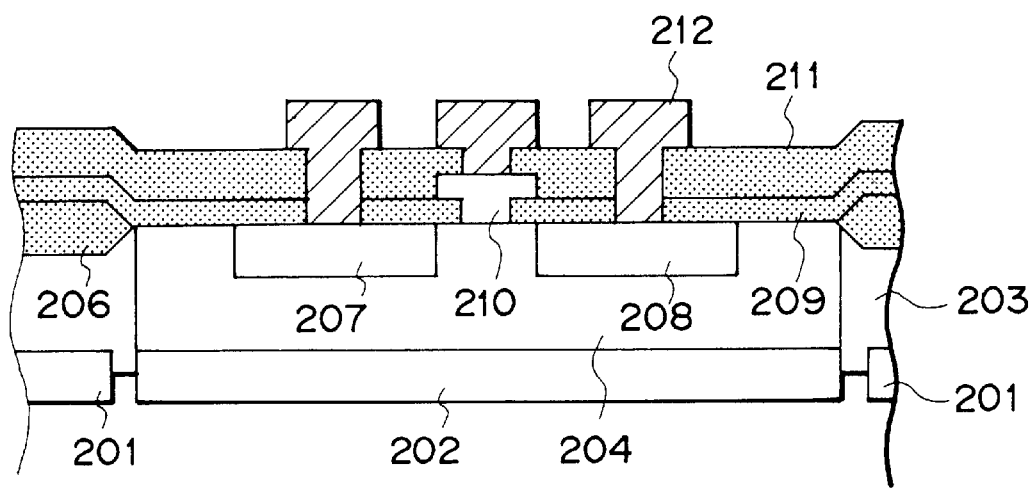

FIG. 12 shows the structure of a fifth embodiment according to the present invention.

In this embodiment, the process up to FIG. 3D and from FIG. 3I to the end is the same as the embodiment 1. Accordingly, only the process as shown in FIGS. 3E to 3H will be described below.

After the process proceeded to FIG. 3D, As$^+$ ions were implanted with a dose of 1×10$^{15}$ atoms/cm$^2$ and an acceleration voltage of 40 keV, with a mask of a desired shape applied, and subsequently, the diffusion of As$^+$ ions was made by annealing in the N$_2$ atmosphere at 1000° C. to form an emitter region 207 and a collector region 208.

Thereafter, SiO$_2$ 209 was deposited 3000 Å thick by normal atmospheric pressure CVD to have an interlayer insulating film, and etched in a desired shape through a normal photolithography process to form an opening portion.

Subsequently, a polysilicon layer 210 was deposited 4400 Å thick by a normal low pressure CVD. And Ge$^+$ ions were implanted into the polysilicon layer 210 with a dose of 5×10$^{15}$ atoms/cm$^2$ and an acceleration voltage of 150 keV, and further B$^+$ ions were implanted thereinto with a dose of 5×10$^{15}$ atoms/cm$^2$ and an acceleration voltage of 30 keV. Then, the diffusion of Ge$^+$ ions and B$^+$ ions was made by annealing in the N$_2$ atmosphere at 950° C. to convert the polysillicon layer into a P-type.

In the figure, 201 is an N-type blocking layer, 202 is a P-type blocking layer, 203 is an epitaxial layer, 204 is a P well, 205 is a silicon nitride film, 206 is a field oxide film, 211 is an interlayer insulating film, and 212 is a wiring electrode. The material, thickness and fabrication method for each film, not specifically described, are the same as in embodiment 1.

A comparison between the semiconductor device (semiconductor device E) formed in the above manner and the semiconductor device (semiconductor device F) formed without Ge injection into the polysilicon portion indicated that the leakage current in low voltage range was very large in the Vbe-Ic, Ib characteristic for the semiconductor device B, while in the semiconductor device E, it was almost suppressed, and there was clearly seen a relation that Ic, Ib depends exponentially on Vbe in the range of Vbe from 0 to 0.5 V.

Embodiment 6

Figure 13:
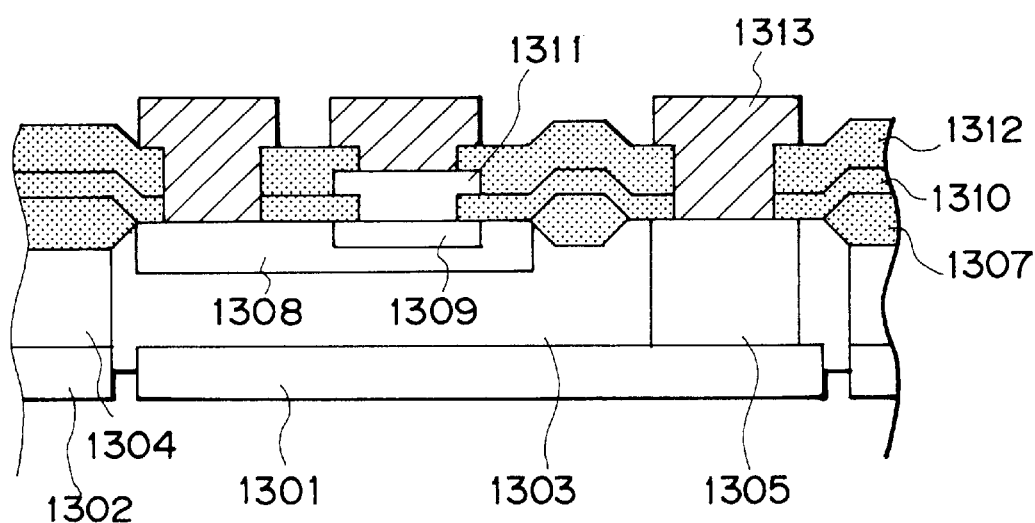

FIG. 13 shows the structure of a sixth embodiment according to the present invention.

First, As$^+$ ions were implanted into a p-type substrate under the conditions with a dose of $1 \times 10^{15}$ atoms/cm$^2$ and an acceleration voltage of 60 keV by a normal ion injection method, with a mask of desired shape, and thereafter the diffusion of As$^+$ ions was made by annealing in the N$_2$ atmosphere at 1000° C. to form an N-type blocking layer 1301.

Subsequently, B$^+$ ions were implanted under the conditions with a dose of $2 \times 10^{13}$ atoms/cm$^2$ and an acceleration voltage of 60 keV, with a mask of desired shape applied, and the diffusion of B$^+$ ions was made by annealing in the N$_2$ atmosphere at 1000° C. to form a P-type blocking layer 1302. Then, N-type epitaxial growth was made on this substrate to form an epitaxial layer 1303 having a thickness of 5 μm.

Thereafter, B$^+$ ions were implanted by a normal ion injection method under the conditions with a dose of $6 \times 10^{12}$ atoms/cm$^2$ and an acceleration voltage of 100 keV, with a mask of a desired shape applied, and the diffusion of B$^+$ ions was made by annealing in the N$_2$ atmosphere at 1000° C. to form a P well 1304.

Subsequently, B$^+$ ions are implanted by normal ion injection method under the conditions with a dose of $7 \times 10^{15}$ atoms/cm$^2$ and an acceleration voltage of 30 keV, with a mask of a desired shape applied, and the annealing was made in the N$_2$ atmosphere at 1000° C. to form a contact region 1305 of the P-type blocking layer 1302.

Then, a silicon nitride film 1306 was deposited 1500 Å thick by normal low pressure CVD and patterned in a desired shape. Subsequently, oxidation was made for five hours at 1000° C. in the atmosphere of O$_2$=4Λ/min, H$_2$=2Λ/min and N$_2$=5Λ/min to form a field oxide film 1307, and then the silicon nitride film 1306 was removed.

Thereafter, P$^+$ ions were implanted by a normal ion injection method under the conditions with a dose of $4 \times 10^{13}$ atoms/cm$^2$ and an acceleration voltage of 85 keV, with a mask of a desired shape applied, and the diffusion of P$^+$ ions was made by annealing in the N$_2$ atmosphere at 1000° C. to form a base region 1308.

Further, BF$^+_2$ ions were implanted under the conditons with a dose of $1 \times 10^{15}$ atoms/cm$^2$ and an acceleration voltage of 85 keV, with a mask of a desired shape applied, and Ge$^+$ ions were implanted under the conditions with a dose of $5 \times 10^{14}$ atoms/cm$^2$ and an acceleration voltage of 100 keV. Further, the diffusion of BF$^+_2$ ions and Ge$^+$ ions was made by annealing in the N$_2$ atmosphere at 1000° C. to form an emitter region 1309.

Thereafter, an SiO$_2$ film 1310 was deposited 3000 Å thick by a normal atmospheric pressure CVD to have an interlayer insulating film, and etched in a desired shape through a normal photolithography process to form an opening portion.

Subsequently, a polysilicon layer 1311 was deposited 4400 Å thick by a normal low pressure CVD. Subsequently, Ge$^+$ ions were implanted into the polysilicon layer 1311 with a dose of $5 \times 10^{14}$ atoms/cm$^2$ and an acceleration voltage of 150 keV, and further B$^+$ ions were implanted with a dose of $5 \times 10^{15}$ atoms/cm$^2$ and an acceleration voltage of 30 keV. Thereafter, the diffusion of Ge$^+$ ions and B$^+$ ions was made by annealing in the N$_2$ atmosphere at 950° C. to convert the polysilicon layer into a P-type. The injection of Ge$^+$ ions is desirably effected in the range as shown in FIG. 10.

Subsequently, the polysilicon layer 1311 was etched in a desired shape through a normal photo-lithography process.

Thereafter, an SiO$_2$ film was deposited 6000 Å thick by a normal atomospheric pressure CVD to have an interlayer insulating film 1312, and etched in a desired shape through a normal photolithography process to form an opening portion.

Then, AlSi was deposited 10000 Å thick by a normal sputtering method, and subsequently, etched in a desired shape through a normal photolithography process. Further, heat treatment was conducted in the N$_2$ atmosphere at 450° C. for 30 minutes to make an alloy of AlSi and polysilicon. Thereby, wiring electrodes 1313 were formed and a semiconductor device of the present invention was completed.

A comparison between the semiconductor device formed in the above manner and the semiconductor device B formed in the embodiment 4 indicated that the short-circuit between emitter and base due to the diffusion of the Al electrode was eliminated and the yield was much improved.

Embodiment 7

Figure 14:
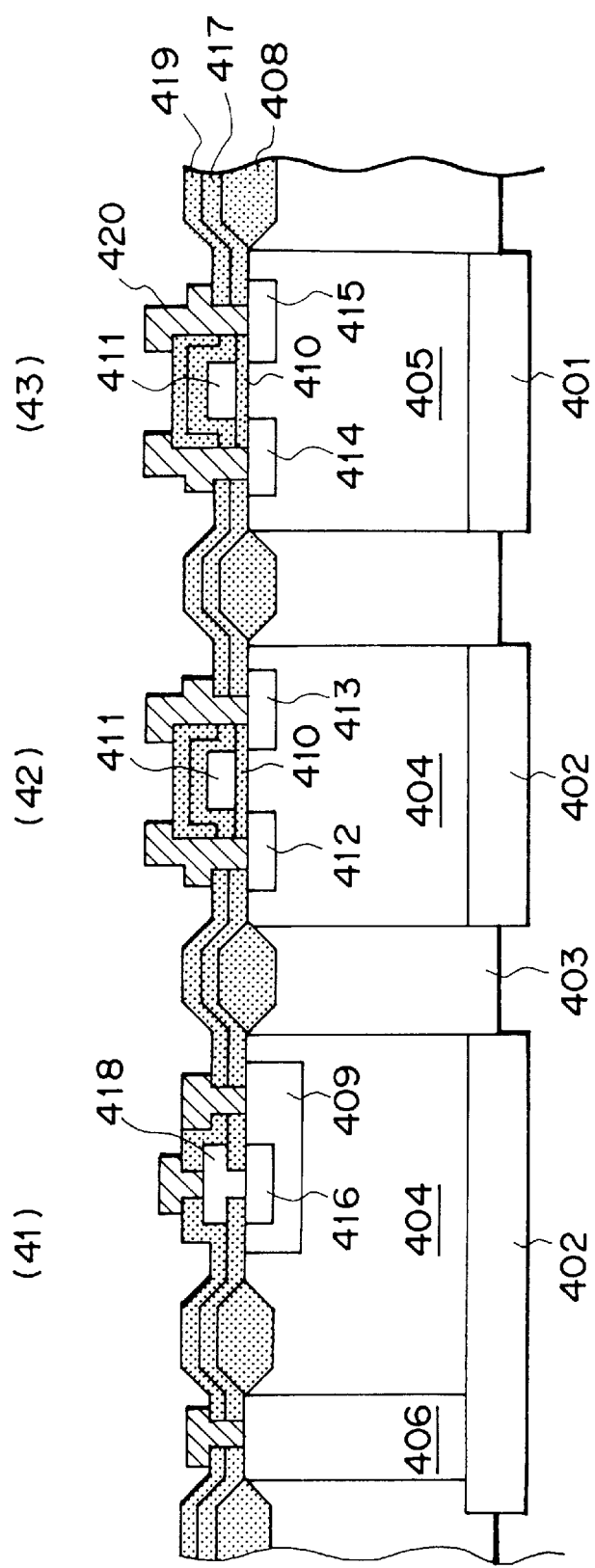

FIG. 14 shows the structure of a seventh embodiment according to the present invention.

First, As$^+$ ions are implanted into a p-type substrate under the conditons with a dose of $1 \times 10^{15}$ atoms/cm$^2$ and an acceleration voltage of 60 keV by a normal ion injection method, with a mask of a desired shape, and thereafter the diffusion of As$^+$ ions was made by annealing in the N$_2$ atmosphere at 1000° C. to form an N-type blocking layer 401. Subsequently, B$^+$ ions were implanted under the conditions with a dose of $2 \times 10^{13}$ atoms/cm$^2$ and an acceleration voltage of 60 keV, with a mask of a desired shape applied, and the diffusion of B$^+$ ions was made by annealing in the N$_2$ atmosphere at 1000° C. to form a P-type blocking layer 402. Epitaxial growth was made on this substrate to form an epitaxial layer 403 having a thickness of 5 μm. Thereafter, B$^+$ ions were implanted by a normal ion injection method under the conditions with a dose of $6 \times 10^{13}$ atoms/cm$^2$ and an acceleration voltage of 100 keV, with a mask of a desired shape applied, and the diffusion of B$^+$ ions was made by annealing in the N$_2$ atmosphere at 1000° C. to form a P well 404.

Subsequently, P$^+$ ions were implanted by a normal ion injection method under the conditions with a dose of $8 \times 10^{13}$ atoms/cm$^2$ and an acceleration voltage of 150 keV, with a mask of a desired shape applied, and the diffusion of P$^+$ ions was made by annealing in the N$_2$ atmosphere at 1000° C. to form an N well 405.

Subsequently, B$^+$ ions were implanted by a normal ion injection method under the conditions with a dose of $8 \times 10^{15}$ atoms/cm$^2$ and an acceleration voltage of 150 keV, with a mask of desired shape applied, and the diffusion of B$^+$ ions was made by annealing in the N$_2$ atmosphere at 1000° C. to form a collector contact portion 406.

Then, a silicon nitride film 407 was deposited 1500 Å thick by a normal low pressure CVD and patterned in a desired shape. Subsequently, oxidation was made for five hours at 1000° C. in the atmosphere of O$_2$=4Λ/min, H$_2$=2Λ/min and N$_2$=5Λ/min to form a field oxide film 408, and then the silicon nitride film 407 was removed.

Thereafter, P$^+$ ions were implanted by a normal ion injection method under the conditions with a dose of $6 \times 10^{13}$ atoms/cm$^2$ and an acceleration voltage of 50 keV, with a photo-resist mask of a desired shape applied, and the diffusion of P$^+$ ions was made by annealing in the N$_2$ atmosphere at 950° C. to form a base region 409 of a PN BJT portion 41.

Then, $SiO_2$ 410 was formed 500 Å thick on the surface by normal thermal oxidation to form a gate insulating film.

Subsequently, a polysilicon layer 411 was deposited 4400 Å thick by a normal low pressure CVD. Then, $P^+$ ions were implanted into the polysilicon layer 411 with a dose of $5\times10^{15}$ atoms/cm$^2$ and an acceleration voltage of 80 keV, and the diffusion of $P^+$ ions was performed by annealing in the $N_2$ atmosphere at 950° C. to convert the polysilicon layer into a N-type.

Subsequently, the polysilicon layer 411 was etched in a desired shape through a normal photolithography process.

Then, after masking in a desired shape with a photoresist, $As^+$ ions were implanted by normal ion injection with a dose of $1\times10^{15}$ atoms/cm$^2$ and an acceleration voltage of 80 keV to inject ions into the portion corresponding to a source 412 and a drain 413 of an NMOS portion 42.

Subsequently, after masking in a desired shape with a photoresist, $BF^+_2$ ions were implanted by normal ion injection with a dose of $2\times10^{15}$ atoms/cm$^2$ and an acceleration voltage of 50 keV to inject ions into the portion corresponding to a source 414 and a drain 415 of a PMOS portion 43 and the portion corresponding to an emitter 416 of a PNP BJT portion 41. Then, the diffusion of $As^+$ ions and $B^+$ ions was performed by annealing in the $N_2$ atmosphere at 950° C.

Thereafter, an $SiO_2$ film was deposited 6000 Å thick by a normal atmospheric pressure CVD to have an interlayer insulating film 417, and etched in a desired shape through a normal photolithography process to form an opening portion.

Subsequently, a polysilicon layer 418 was deposited 4400 Å thick by a normal low pressure CVD. $Ge^+$ ions were implanted into the polysilicon layer 418 with a dose of $5\times10^{15}$ atoms/cm$^2$ and an acceleration voltage of 150 keV, and further $B^+$ ions were implanted with a dose of $5\times10^{15}$ atoms/cm$^2$ and an acceleration voltage of 30 keV. Then, the diffusion of $Ge^+$ ions and $B^+$ ions was perfomed by annealing in the $N_2$ atmosphere at 950° C. to convert the polysilicon layer into a P-type. The injection condition of $Ge^+$ ion injection should be contained in the range as shown in FIG. 10.

Subsequently, the polysilicon layer 418 was etched in a desired shape through a normal photolithography process.

Thereafter, an $SiO_2$ film was deposited 6000 Å thick by normal atmospheric pressure CVD to have an interlayer insulating film 419, and etched in a desired shape through a normal photolithography process to form an opening portion.

Then, AlSi was deposited 10000 Å thick by a normal sputtering method, and subsequently, etched in a desired shape through a normal photolithography process. Further, heat treatment was conducted in the $N_2$ atmosphere at 450° C. for 30 minutes to make an alloy of AlSi and polysilicon. Thereby, wiring electrodes 420 were formed and a semiconductor device of the present invention was completed.

Figure 15:
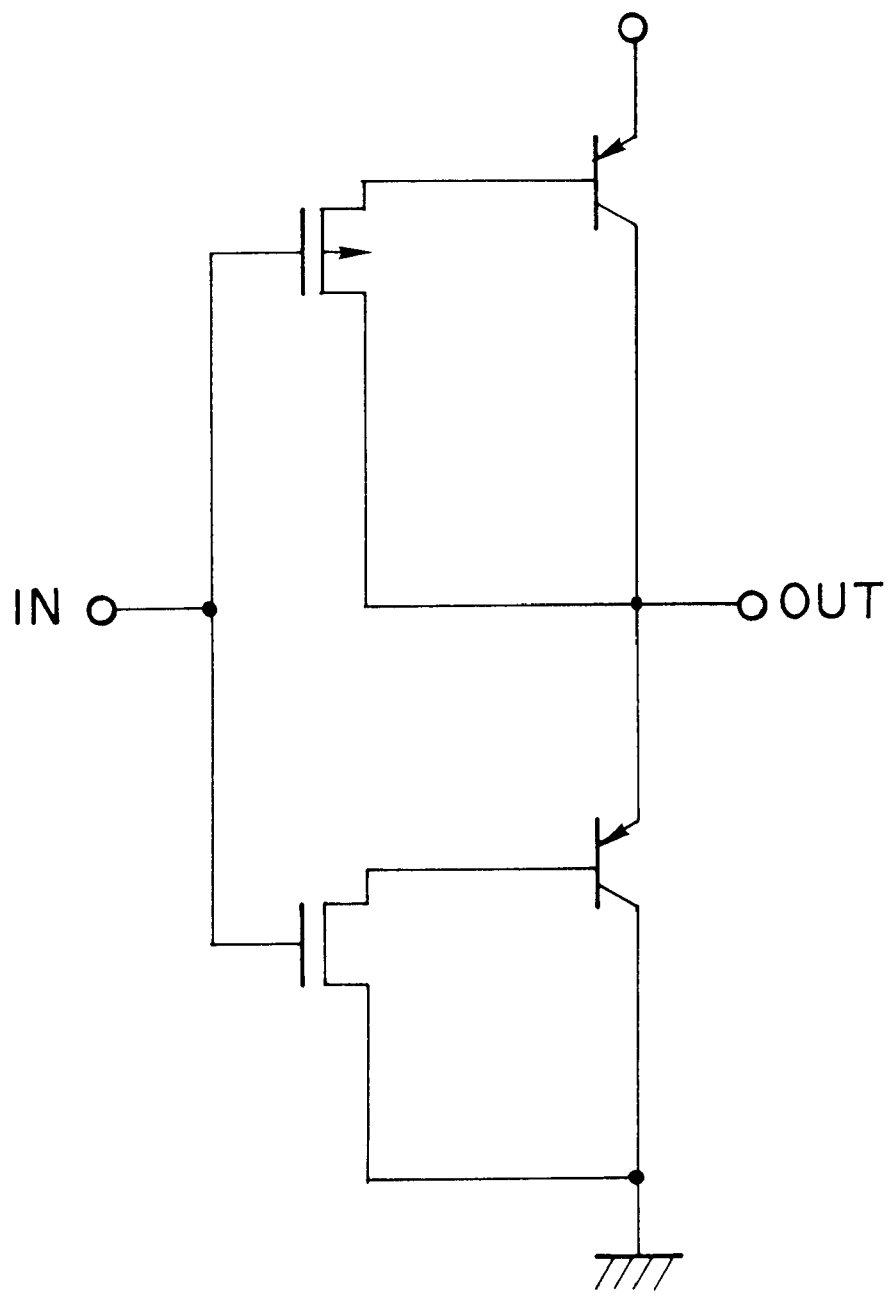
FIG. 15 is a circuit diagram for illustrating a circuit configuration using a semiconductor device of the present invention.

The evaluation for the semiconductor device (semiconductor device G) as formed in the above way for the delay time with a circuit configuration as shown in FIG. 15 indicated that the time constant was reduced by about 70 to 80%, as compared with the semiconductor device (semiconductor device H) fabricated with the emitter electrode of PNP BJT formed off the position directly above the base portion.

While polysilicon was used as polycrystalline semiconductor material in the above embodiments 4 to 7, it should be noted that germanium can be used as the main component.

Also, while Ge was used as the injection material in the first injection process in the above embodiments 4 to 7, it should be noted that the same effects can be also obtained by using tin, phosphorus, arsenic, antimony, gallium, or indium.

As described above, with the present invention, the structure or method without involving any complex process or increase of cost in the contact portion of the semiconductor device can be used to suppress the diffusion of a low-melting metal, and it is possible to provide a semiconductor device without degradation in element characteristics and a fabrication method thereof.

Further, with the present invention, the impurity concentration near the surface of a polycrystalline semiconductor layer can be especially increased by practicing a step of ion injecting impurities having a large range into the polycrystalline semiconductor layer such as polycrystalline silicon and a step of ion injecting impurities having a small range to form the crystal having large crystal grain diameter particularly near the surface by subsequent heat treatment.

In this way, with the present invention, the diffusion passages of wiring metal formed on the upper layer can be reduced by making the grain diameter of polycrystalline silicon larger than conventional, and the diffusion of wiring metal into the semiconductor element region can be suppressed, whereby the degradation of element characteristics can be prevented.

Also, the step of forming a barrier metal which was conventionally provided can be eliminated, so that there is the effect that the process can be simplified and the cost reduced.

Also, the contact poriton can be disposed directly above the element, but not at the position far away from the element region in fear of metal diffusion, thereby eliminating the need of the excess wiring, whereby there is the effect that the high speed operation as well as the stable characteristic can be realized.

More specifically, referring to the Vbe-Ic, Ib characteristic, it will be found that the lead current in the low voltage range has been almost suppressed, and the characteristic improved.

Also, the short-circuit between emitter and base due to the diffusion of an Al electrode can be completely eliminated, so that the yield has been greatly improved.

A comparison of a semiconductor device having the emitter electrode of PNP BJT placed off the site directly above the base portion with a delay circuit indicated that the time constant was reduced by about 70 to 80%.

It will be understood that the present invention is not limited to the embodiments and the drawings as above stated, and various variations and combinations can be appropriately effected within the scope and spirit of the present invention.

What claimed is:

1. A method for fabricating a semiconductor devise having a wiring part connected, via an opening portion formed in an insulating film on a semiconductor region, to said semiconductor region, wherein said wiring part comprises a polycrystalline semiconductor layer and a metal or metal silicide on said polycrystalline semiconductor layer, comprising the steps, in forming said wiring part, of:

depositing a first layer of polycrystalline semiconductor over said opening portion of said semiconductor region, said first layer having a surface side opposite to a side facing said opening portion and further having first grains;

injecting as a first impurity an ion selected from a group consisting of Ge, Sn, P, As, Sb, Ga and In in a manner of an ion-implantation into said first layer so as to amount to more than $5\times10^{19}$ atoms/cm$^3$ to convert at least a part of the polycrystalline semiconductor of said first layer at said surface side into an amorphous state;

injecting, into the first layer of said polycrystalline semiconductor, second impurities which have a projection range shorter than that of the first impurities, and which operate as p-type or n-type impurities having a lower mass or lower energy than that of an element of the first impurities, so that a desired region with a high concentration of p-type or n-type impurities is formed, at said surface, wherein the total concentration of impurities is greater than $5\times10^{19}$ atoms/cm$^3$ at a depth of 1000 Å from the surface of said semiconductor layer;

conducting heat treatment, after the injection of said impurities, whereby the size of the crystal of said first layer at the side wherein at least said metal or metal silicide is brought into contact and located is made larger than the size of said polycrystalline semiconductor layer before said introduction of the impurity; and depositing the metal or metal silicide containing a low-melting metal on the region having the second impurity in the more enlarged grains on said polycrystalline semiconductor layer so as to use the region as a contact portion after the heat treatment.

2. A method for fabricating a semiconductor device according to claim 1, characterized in that said polycrystalline semiconductor is polycrystalline silicon or polycrystalline silicon germanium.

3. A method for fabricating a semiconductor device according to claim 1, characterized in that the total concentration of impurities is greater than $5\times10^{20}$ atoms/cm$^3$.

4. A method for fabricating a semiconductor device comprising a wiring part, connected via an opening portion formed in an insulating film on a semiconductor region, to said semiconductor region, wherein said wiring part comprises a polycrystalline semiconductor layer and metal or metal silicide on the polycrystalline semiconductor layer, comprising the steps, in forming said wiring part, of:

depositing a first layer of a polycrystalline semiconductor over said opening portion on said semiconductor region, said first layer having a surface side opposite to a side facing said opening portion and further having first crystals;

injecting high-energy phosphorus ions as a first impurity, operating as an n-type impurity, and at least one kind of ion selected from a group consisting of phosphorus ions having an energy lower than said phosphorus ion as the first impurity and ions of As, Sb and Bi as a second impurity, respectively in that order, into said first layer, in an injection process wherein the ion projection range of the first impurity is longer than that of the second impurity and the concentration of the first impurity amounts to more than $5\times10^{19}$ atoms/cm$^3$, whereby at least a part of the first layer is amorphized to form a high impurity concentration region on at least the surface side of said first layer, wherein the total concentration of impurities is greater than $5\times10^{19}$ atoms/cm$^3$ at a depth of 1000 Å from the surface of said first layer;

conducting heat treatment, after the injection of the impurities, whereby the amorphized part is recrystallized at the side in which at least the said metal or metal silicide is established, to grow the crystal of said first layer larger than the size of the crystal of said polycrystalline semiconductor layer at the stage before introducing the impurity; and depositing metal or metal silicide including a low metaling point metal on a region which functions as a contact region and in which the crystal size was made larger after the heat treatment.

5. A method according to claim 4, wherein
said polycrystalline semiconductor is polycrystalline silicon or polycrystalline silicon germanium.

6. A method according to claim 4, wherein a total concentration of the impurities is higher than $5\times10^{20}$ atoms/cm$^3$.

7. A method according to claim 4, wherein both the first and the second impurities are phosphorus, and the second impurity is injected with an energy lower than that used for injecting the first impurity.

* * * * *

UNITED STATES PATENT AND TRADEMARK OFFICE
CERTIFICATE OF CORRECTION

PATENT NO.   : 6,190,911 B1
DATED        : February 20, 2001
INVENTOR(S)  : Ihachiro Gofuku It is certified that error appears in the above-identified patent and that said Letters Patent is hereby corrected as shown below:

<u>Title page,</u>
Item [56] OTHER PUBLICATIONS
"Ply-Si", L.R. Zheng et al.," should read -- Poly-Si", L.R. Zheng et al., --.

<u>Column 2,</u>
Line 67, "there-into." should read -- thereinto. --.

<u>Column 3,</u>
Line 18, "as the boundary" should be deleted;
Line 21, "pp. 135-48)." should read -- pp. 143-48). --.

<u>Column 4,</u>
Line 61, "a" (first occurrence) should be deleted; and "desired" should read
-- a desired --.

<u>Column 5,</u>
Line 16, "atmo-sphere" should read -- atmosphere --.

<u>Column 6,</u>
Line 7, "low a" should read -- a low --;
Line 27, "large" should read -- a large --;
Line 30, "small" should read -- a small --.

<u>Column 7,</u>
Line 57, "desired" should read -- a desired --.

<u>Column 8,</u>
Line 7, "P-type" should read -- a P-type --;
Line 62, "low" should read -- a low --.

<u>Column 9,</u>
Lines 7 and 13, "desired" should read -- a desired --;
Lines 25 and 33, "normal" should read -- a normal --;
Line 35, "$O_2=4\Lambda/min, H_2=2\Lambda/$" should read $O_2=4\ell/min, H_2=2\ell/$ --;
Line 36, "$N_2=5\Lambda/min$" should read -- $N_2=5\ell/min$ --.

UNITED STATES PATENT AND TRADEMARK OFFICE
CERTIFICATE OF CORRECTION

PATENT NO. : 6,190,911 B1
DATED : February 20, 2001
INVENTOR(S) : Ihachiro Gofuku It is certified that error appears in the above-identified patent and that said Letters Patent is hereby corrected as shown below:

Column 10,
Line 52, "desired" should read -- a desired --;
Line 58, "$O_2=4\Lambda/min, H_2=2\Lambda/$" should read $O_2=4\ell/min, H_2=2\ell/$ --;
Line 59, "$N_2=5\Lambda/min$" should read -- $N_2=5\ell/min$ --.

Column 11,
Lines 18 and 44, "normal" should read -- a normal --.

Column 12,
Line 54, "claimed" should read -- is claimed --;
Line 55, "devise" should read -- device --.

Signed and Sealed this

Twenty-sixth Day of February, 2002

*Attest:*

JAMES E. ROGAN
*Attesting Officer*       *Director of the United States Patent and Trademark Office*